(12) United States Patent
Zheng et al.

(10) Patent No.: US 12,146,925 B2
(45) Date of Patent: Nov. 19, 2024

(54) DIRECT CURRENT (DC) TRANSFORMER ERROR DETECTION APPARATUS FOR PULSATING HARMONIC SIGNAL

(71) Applicant: State Grid Hubei Marketing Service Center (Measurement Center), Hubei (CN)

(72) Inventors: Xin Zheng, Hubei (CN); Wenjing Yu, Hubei (CN); Tao Peng, Hubei (CN); Yi Fang, Hubei (CN); Ming Lei, Hubei (CN); Hong Shi, Hubei (CN); Ben Ma, Hubei (CN); Li Ding, Hubei (CN); Wei Wei, Hubei (CN); Linghua Li, Hubei (CN); He Yu, Hubei (CN); Tian Xia, Hubei (CN); Yingchun Wang, Hubei (CN); Sike Wang, Hubei (CN); Dongri Xie, Hubei (CN); Xin Wang, Hubei (CN); Bo Pang, Hubei (CN); Xianjin Rong, Hubei (CN)

(73) Assignee: State Grid Hubei Marketing Service Center (Measurement Center), Wuhan (CN)

( * ) Notice: Subject to any disclaimer, the term of this patent is extended or adjusted under 35 U.S.C. 154(b) by 0 days.

(21) Appl. No.: 18/012,977

(22) PCT Filed: Aug. 17, 2022

(86) PCT No.: PCT/CN2022/112913
§ 371 (c)(1),
(2) Date: Dec. 26, 2022

(87) PCT Pub. No.: WO2023/040557
PCT Pub. Date: Mar. 23, 2023

(65) Prior Publication Data
US 2024/0103097 A1    Mar. 28, 2024

(30) Foreign Application Priority Data

Sep. 16, 2021  (CN) .......................... 202111087869.0

(51) Int. Cl.
G01R 31/62       (2020.01)
(52) U.S. Cl.
CPC .................................... G01R 31/62 (2020.01)
(58) Field of Classification Search
CPC ........ G01R 31/62; G01R 31/40; G01R 35/02; H02M 1/32; H02M 1/327
(Continued)

(56) References Cited

FOREIGN PATENT DOCUMENTS

CN          209044052 U  *  6/2019  ............. G01R 35/02

OTHER PUBLICATIONS

English translation of CN 209044052 U (Year: 2019).*

* cited by examiner

*Primary Examiner* — Alesa Allgood
*Assistant Examiner* — Courtney G McDonnough

(57) ABSTRACT

The present disclosure provides a direct current (DC) transformer error detection apparatus for a pulsating harmonic signal, including a DC and pulsating harmonic current output module and an external detected input module, where the DC and pulsating harmonic current output module outputs a DC and a DC superimposed pulsating harmonic current to an internal sampling circuit and a self-calibrated standard resistor array; and the internal sampling circuit converts the input DC and the input DC superimposed pulsating harmonic current into a voltage signal, and sends the voltage signal to an analog-to-digital (AD) sampling and measurement component through a front-end conditioning circuit and a detected input channel. The DC transformer error detection apparatus can complete self-calibration for
(Continued)

measurement of the DC and the pulsating harmonic signal on a test site.

5 Claims, 2 Drawing Sheets

(58) Field of Classification Search
USPC .......................................................... 324/547
See application file for complete search history.

DIRECT CURRENT (DC) TRANSFORMER ERROR DETECTION APPARATUS FOR PULSATING HARMONIC SIGNAL

TECHNICAL FIELD

The present disclosure relates to the technical field of direct current (DC) transmission, and in particular, to a DC transformer error detection apparatus for a pulsating harmonic signal.

BACKGROUND

A DC transformer and its DC amplifier in a converter station are important secondary measurement components of a DC transmission system. They provide key information and data of controlling, protection and measurement for the transmission system. Accurate and reliable operation of the DC transformer and the DC amplifier has a direct impact on safe and stable operation of the entire DC transmission system. In this circumstance, a DC transformer error detection apparatus with standard values is required to perform in-field testing and error calibration to ensure accuracy and reliability of the DC transformer and the DC amplifier, and the DC transformer error detection apparatus is a key component for detecting errors of the DC transformer and the DC amplifier. The DC transformer error detection apparatus can be used to verify errors for DC transformers only after themself being verified and calibrated by a qualified institution. As the converter station is generally built in remote areas to reduce impact of radiation on surrounding residents, and detection personnel have to carry the DC transformer error detection apparatus to detect the DC transformer and the DC amplifier in the converter station, it is difficult to guarantee accuracy of the transformer error detection apparatus after long-distance transportation and rough handling. In addition, when detecting a transformer, the accuracy of the DC transformer error detection apparatus may be affected by overcurrent, overvoltage, abnormal wiring, and other abnormal conditions, and cannot be strictly guaranteed. In this case, the DC transformer error detection apparatus needs to be verified and calibrated again by a qualified institution. Due to a long distance from the qualified institution, the DC transformer error detection apparatus probably cannot be verified or calibrated in a short time. As a result, the detection personnel may need to travel to and from the converter station and the verification institution for several consecutive days, thus causing a great waste of manpower and time. What's more, in the prior art, the DC transformer error detection apparatus is usually verified and calibrated based on by using a DC source in combination with a DC standard transformer, or based on an alternating current (AC) by using an AC source in combination with an AC standard transformer. For 50 Hz to 1.2 KHz pulsating harmonic signals, an additional component is required for calibration. Although there are high-precision and wide-range AC/DC diverters overseas, they are too expensive for relevant institutions or manufacturers to purchase. The verification process in the prior art is complex and imposes a high requirement for verification personnel, and a verification result may need repeated tests, resulting in a great waste of manpower and time. In addition, as the DC transformer in the converter station usually operates under the condition of DC superimposed pulsating harmonic signals, the verification also needs to be performed under the condition of the DC superimposed pulsating harmonic signals based on the actual situation. However, the prior art lacks corresponding verification means for error detection apparatuses for the DC transformer and the DC amplifier.

SUMMARY

The present disclosure aims at the above shortcomings in the prior art and provides a DC transformer error detection apparatus with pulsating harmonic characteristics, to improve accuracy of a DC transformer and a DC amplifier, and achieve a small size, a light weight, and simple operations.

To achieve the foregoing objective, the present disclosure adopts the following technical solutions:

The present disclosure provides a DC transformer error detection apparatus for a pulsating harmonic signal, including a DC and pulsating harmonic current output module and an external detected input module, wherein the DC and pulsating harmonic current output module is configured to output a DC and a DC superimposed pulsating harmonic current to an internal sampling circuit and a self-calibrated standard resistor array;

the internal sampling circuit is configured to convert the input DC and the input DC superimposed pulsating harmonic current into a voltage signal, and to send the voltage signal to an analog-to-digital (AD) sampling and measurement component through a front-end conditioning circuit and a detected input channel;

the self-calibrated standard resistor array is configured to convert the input DC and the input DC superimposed pulsating harmonic current into a voltage signal, and to send the voltage signal to the AD sampling and measurement component through a channel converter and a standard input channel; and the external detected input module is configured to converts an externally input detected signal into a suitable AD sampling range by means of the channel converter, and to send the AD sampling range to the AD sampling and measurement component through the standard input channel.

Further, the AD sampling and measurement component is connected to an error self-calibration module, and the error self-calibration module is configured to calculate error data to be corrected and a correction value based on a digital signal of the AD sampling and measurement component, and to write the error data to be corrected and the correction value to a flash module for storage.

Further, the error self-calibration module is configured to receive the sampled digital signal of the AD sampling and measurement component, to separate DC component and harmonically related components based on Fourier transform algorithm, to respectively calculate an angular difference between harmonic signals of the detected input channel and the standard input channel, a ratio difference between the harmonic signals, an amplitude error of the DC, and an original calibration coefficient in the flash module, and to calculate a corrected new calibration coefficient, such that a self-calibration is completed after multi-fold calibration.

Further, an amplitude error calculation module is connected to an error calculation and limit determining module, and when a calculated amplitude error of the DC is within a preset error limit, an error compensation coefficient calculation module which is internally arranged is enabled to compensate for the calculated amplitude error; and an angular difference and ratio difference calculation module is connected to the error calculation and limit determining module, and when an error of the calculated angular difference between the harmonic signals and an error of the calculated ratio difference between the harmonic signals are within preset error limits, the error compensation coefficient calculation module is enabled to compensate for the calculated angular difference and ratio difference.

Further, the error calculation and limit determining module is connected to an error self-correction coefficient calculation module, and the error self-correction coefficient calculation module is connected to an original calibration coefficient calculation module; and in a self-calibration mode, a new calibration coefficient calculated by the error self-correction coefficient calculation module is written into the flash module for storage.

The present disclosure has the following beneficial effects: The DC transformer error detection apparatus uses the standard resistor array with high accuracy, good long-term stability, and low inductive reactance as a traceability standard to verify accuracy of a DC transformer and a DC amplifier under the condition of the DC and the DC superimposed pulsating harmonic signal, and completes self-calibration for measurement of the DC and the pulsating harmonic signal on a test site.

The DC transformer error detection apparatus has a small size, a light weight, and simple operations, and is safe and reliable. It greatly reduces costs of manpower, material resources and time, and has good economical efficiency and practicality.

DETAILED DESCRIPTION

To make the objectives, technical solutions, and advantages of the present disclosure clearer, the present disclosure is described in more detail below with reference to the accompanying drawings. It should be understood that the specific embodiments described herein are merely intended to explain the present disclosure, rather than to limit the present disclosure.

Figure 1:
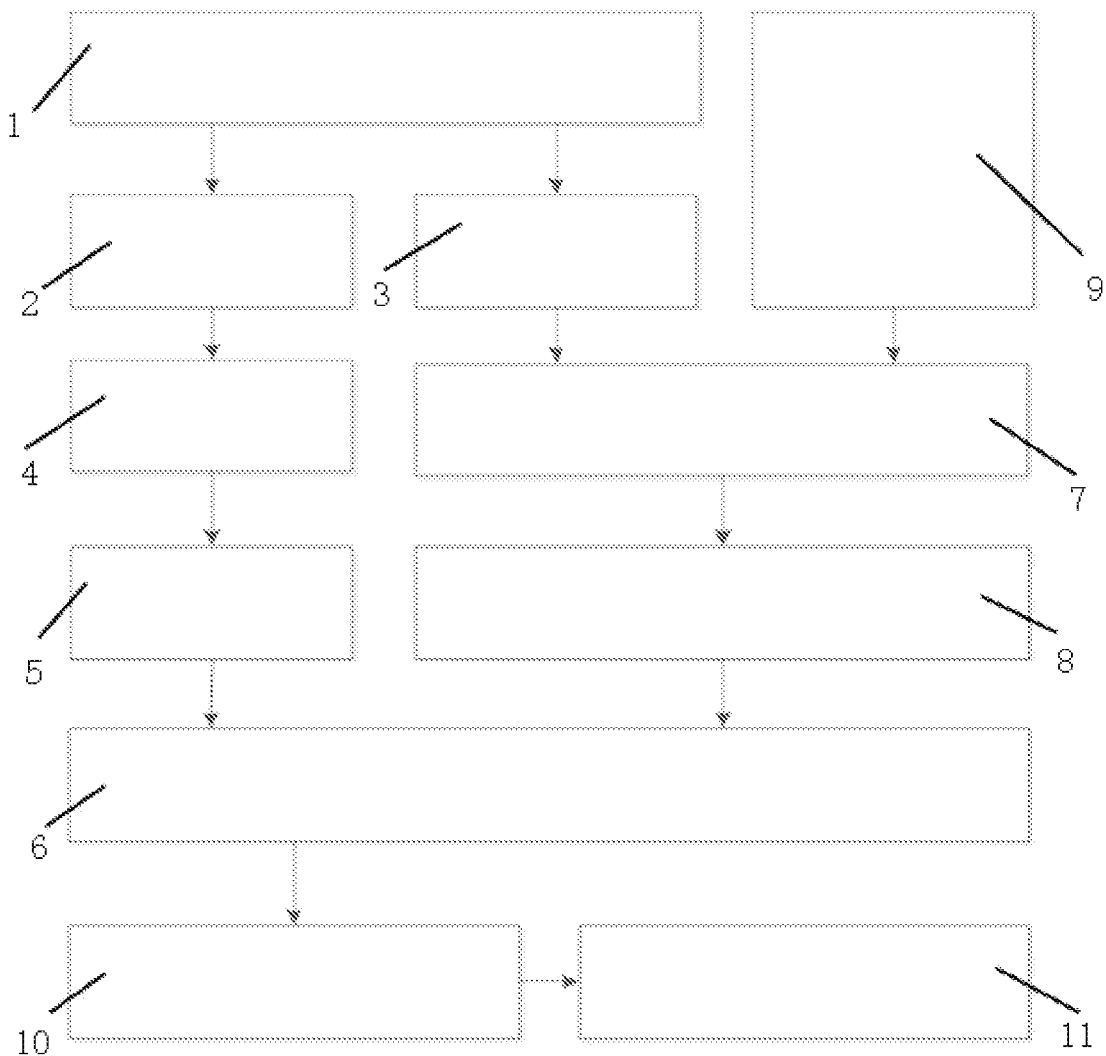
FIG. 1 is a system diagram of a DC transformer error detection apparatus for a pulsating harmonic signal according to the present disclosure.

As shown in FIG. 1, a DC transformer error detection apparatus for a pulsating harmonic signal includes a DC and pulsating harmonic current output module 1 and an external detected input module 9.

The DC and pulsating harmonic current output module 1 outputs a DC and a DC superimposed pulsating harmonic current to an internal sampling circuit 2 and a self-calibrated standard resistor array 3.

Herein, the self-calibrated standard resistor array 3, which realize self-calibration in the case of DC or DC superimposed harmonic wave, requires a small temperature drift, high accuracy, good long-term stability, and low inductive reactance. Specifically, the error detection apparatus needs to work on site. A working temperature range is from 0° C. to 50° C., and a temperature drift has great impact on accuracy. Therefore, the small temperature drift is required. In this case, high-precision 0.05 ppm precision platinum resistors may be selected to form the standard resistor array. The self-calibration accuracy traceability mainly depends on the self-calibrated standard resistor array, and the self-calibrated standard resistor array substantially determines the self-calibration accuracy of the whole system. Therefore, the high accuracy is required. The standard resistor array also needs to ensure its precision for a long time after being calibrated. Therefore, the good long-term stability is required. Further, the low inductive reactance is required due to self-calibration of the DC superimposed pulsating harmonic signal. A frequency of a pulsating harmonic signal is high and reaches 1.2 KHz, which requires a standard resistor to have low inductive reactance, to reduce impact of the inductive reactance on accuracy of the pulsating harmonic wave and ensure accuracy of measurement and traceability of the pulsating harmonic wave.

The internal sampling circuit 2 converts the input DC and the input DC superimposed pulsating harmonic current into a voltage signal, and sends the voltage signal to an AD sampling and measurement component 6 through a front-end conditioning circuit 4 and a detected input channel 5.

Herein, an AD sampling chip of the AD sampling and measurement component 6 is ADS1278 of TI, which has a resolution of 24 bits and eight AD sampling channels.

The self-calibrated standard resistor array 3 converts the input DC and the input DC superimposed pulsating harmonic current into a voltage signal, and sends the voltage signal to the AD sampling and measurement component 6 through a channel converter 7 and a standard input channel 8.

The external detected input module 9 converts the signal of the standard resistor array and an externally input detected signal into a suitable AD sampling range by means of the channel converter 7, and sends the AD sampling range to the AD sampling and measurement component 6 through the standard input channel 8.

The AD sampling and measurement component 6 is connected to an error self-calibration module 10, and the error self-calibration module 10 calculates error data to be corrected and a correction value based on a digital signal of the AD sampling and measurement component 6, and writes the error data to be corrected and the correction value to a flash module 11 for storage.

The error self-calibration module 10 receives the sampled digital signal of the AD sampling and measurement component 6, separates a DC signal from a harmonic signal based on the Fourier transform algorithm, respectively calculates an angular difference between harmonic signals of the detected input channel 5 and the standard input channel 8, a ratio difference between the harmonic signals, an amplitude error of the DC, and an original calibration coefficient in the flash module 11, calculates a corrected new calibration coefficient, such that a self-calibration is completed after multi-fold calibration.

Figure 2:
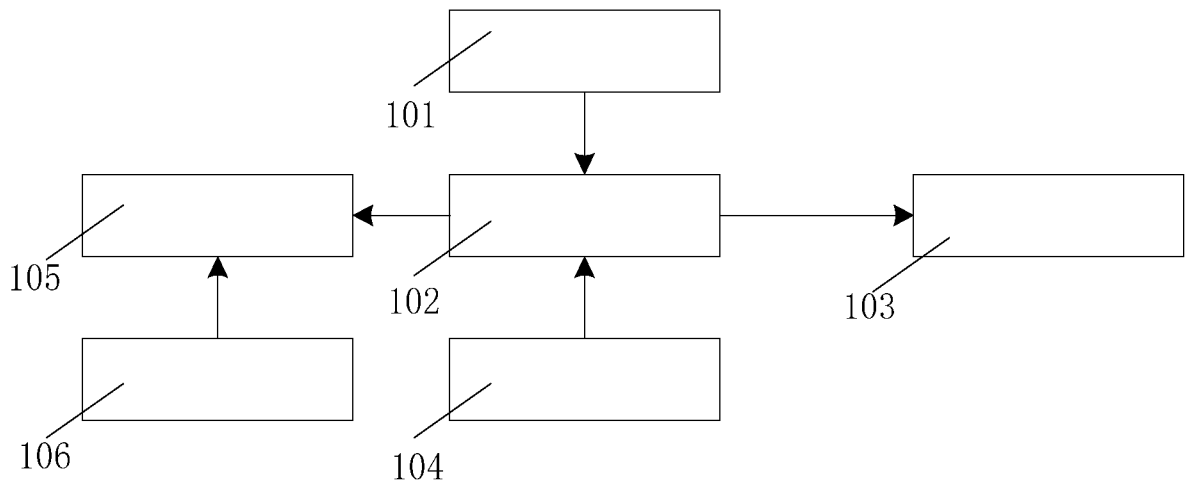
FIG. 2 is a system diagram illustrating error self-calibration modules according to the present disclosure.

Referring to FIG. 2, the error self-calibration module 10 includes an amplitude error calculation module 101, an error calculation and limit determining module 102, an error compensation coefficient calculation module 103, an angular difference and ratio difference calculation module 104, an error self-correction coefficient calculation module 105, and an original calibration coefficient calculation module 106.

The amplitude error calculation module 101 is connected to the error calculation and limit determining module 102. When a calculated amplitude error of the DC is within a preset error limit, the error compensation coefficient calculation module 103 which is internally arranged is enabled to compensate for the calculated amplitude error.

The angular difference and ratio difference calculation module 104 is connected to the error calculation and limit determining module 102. When an error of the calculated angular difference between the harmonic signals and an error of the calculated ratio difference between the harmonic signals are within preset error limits, the error compensation coefficient calculation module 103 which is internally arranged is enabled to compensate for the calculated angular difference and ratio difference.

The error calculation and limit determining module 102 is connected to the error self-correction coefficient calculation module 105, and the error self-correction coefficient calculation module 105 is connected to the original calibration coefficient calculation module 106. In a self-calibration mode, a new calibration coefficient calculated by the error self-correction coefficient calculation module 105 is written into the flash module 11 for storage.

An error compensation coefficient table in the error compensation coefficient calculation module 103 is associated with an error compensation coefficient value, and the error compensation coefficient value is associated with an ambient temperature.

The error compensation coefficient table is established as follows. At a constant ambient temperature, the DC and the pulsating harmonic current of the error detection apparatus are output to the self-calibrated standard resistor array 3 and the internal sampling circuit 2. The AD sampling and measurement component 6 collects values of the standard input channel 8 and the detected input channel 5, and sends the values to the error self-calibration module 10. The error self-calibration module 10 calculates the error compensation coefficient values which indicate system errors of the error self-calibration module 10, i.e., the corresponding amplitude error of the DC, the error of the angular difference between the harmonic signals, and the error of the ratio difference between the harmonic signals. In such a manner, one error compensation coefficient calculation has been completed. Then, an average value can be obtained through repeated calculations, and a final error compensation coefficient value at the constant temperature can be obtained. Up to now, an error compensation coefficient value at one environmental temperature point can be calculated.

To establish a temperature compensation coefficient table, the error self-calibration module 10 provides a temperature compensation value respectively for each degree from 0° C. to 50° C. A corresponding temperature compensation coefficient value is measured at every 1° C. according to the above method. In addition, the standard resistor array is constituted by 0.05 ppm/° C. standard resistors to ensure accuracy of the standard resistor array, so as to ensure accuracy of the error compensation coefficient value. In such a manner, the temperature compensation coefficient table is established.

Figure 3:
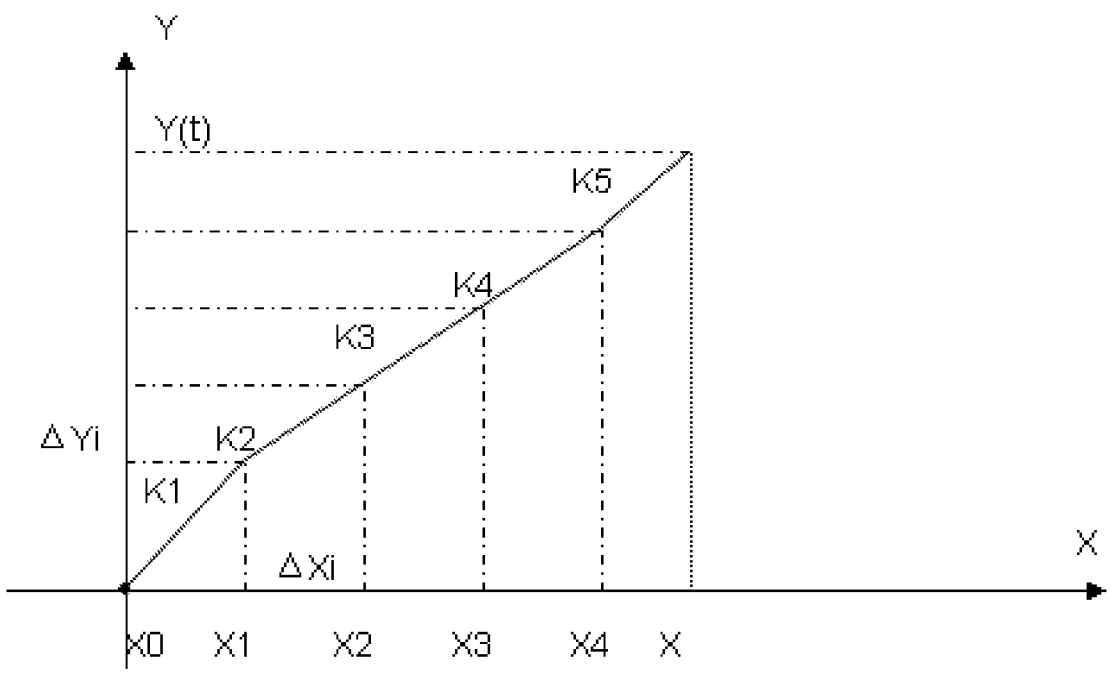
FIG. 3 is a schematic diagram of performing multi-fold calibration by an error self-calibration module.

Referring to FIG. 3, a calibration method for DC transformer error detection for a pulsating harmonic signal is realized by using the DC transformer error detection apparatus for a pulsating harmonic signal.

The error self-calibration module 10 adopts multi-fold calibration, and ensures accuracy of calibration by performing a plurality of calibration calculations.

The error self-calibration module 10 calculates each respective measured value segment $\Delta Y_i$ based on $K_i$ of respective specified segment $\Delta X_i$, and performs cumulative calculation, wherein n depends on the last Ki corresponding to a measured value Y(t). Herein, i=n, a value of a segment point is X, and X is a calibration value between $X_i$ and $X_n$.

$$Y_i(t) = \Sigma_{j=1}^{i-1} K_j^*(X_j - X_{j-1}) + K_i^*(X - X_i)(n \geq 2) \qquad (3\text{-}1)$$

In the above formula, X is actually an abbreviation of X(t), and Y(t) is actually a functional relationship expression of X(t). Since a variable of X(t) is time t, a variable of Y(t) is also the time t. However, actual variables herein are i and n, representing a relationship between Y(t) and X X(t), and j is a local variable.

If n=1 and i=0, the formula can be simplified as follows:

$$Y_1(t) = K_1^*(X - X_0)(n=1) \qquad (3\text{-}2)$$

The calibration coefficient $NK_i$ is calculated based on measured values Y(t) of different specified points, wherein the specified point i is greater than or equal to 2:

$$NK_i = (Y_i - Y_{i-1})/(R_i - R_{i-1}) \qquad (3\text{-}3)$$

It is assumed that $X_{i-1}$ is verified to be accurate, $R_{i-1} = Y_{i-1}$. In this case, the formula 3-3 is rewritten as follows:

$$NK_i = (Y_i - Y_{i-1})/(R_i - Y_{i-1}) \qquad (3\text{-}4)$$

If the specified point is i, the formulas 3-1 can be substituted into the formula 3-4, such that:

$$NKi = (Y_i - Y_{i-1})/(R_i - Y_{i-1})$$

$$= K_i^*(X - X_{i-1})/(R_i - \Sigma_{j=1}^{i-1} K_j^*(X_j - X_{j-1})) \qquad (3\text{-}5)$$

Notes:

$$Y_i(t) = \Sigma_{j=1}^{i-1} K_j^*(X_j - X_{j-1}) + K_i^*(X - X_i)$$

$$Y_{i-1}(t) = \Sigma_{j=1}^{i-1} K_j^*(X_j - X_{j-1})$$

From the formula (3-5), it can be seen that $NK_i$ is related to all previous calibration points ahead of i, and the $i^{th}$ point can be calibrated only after the points previous than i have been calibrated. If a calibration segment is divided into n sub-segments, the calibration needs to be performed for at least n+1 times, to ensure that $NK_i = K_i$.

The error self-calibration module obtains a new calibration coefficient $NK_i$ by performing measurement and calibration for a plurality of times. This calibration coefficient is a new coefficient calculated by the error self-calibration module through self-calibration. After the self-calibration, the new coefficient is written into the flash module for storage. In such a manner, the self-calibration is completed.

Herein, Y(t) represents a measured value of the standard channel of the specified point; X(t) represents a value of a point of a calibration sub-segment within a level range of the specified point; R(t) represents a measured value of the detected channel of the specified point (wherein the standard resistor array is switched to the detected channel); $K_i$ represents an original calibration coefficient of the specified point; $NK_i$ represents a newly calculated calibration coefficient of the specified point; i represents the specified point, and a corresponding temperature compensation coefficient value is measured for each 1° C.; n represents a total quantity of sub-segments; X represents a current percentage; Y represents a measured value of the standard channel; and R represents a measured resistance value of the detected channel.

The above embodiments are merely implementations of the present disclosure, which are described in detail but are not intended to limit the present disclosure. It should be noted that those of ordinary skill in the art can further make several variations and improvements without departing from the concept of the present disclosure. The present invention is intended to cover all modifications and equivalent arrangements falling within the protection scope of the present disclosure. Therefore, the protection scope of the present disclosure shall be defined by the claims.

The invention claimed is:

1. A direct current (DC) transformer error detection apparatus for a pulsating harmonic signal, comprising a DC and pulsating harmonic current output module (1) and an external detected input module (9), wherein
the DC and pulsating harmonic current output module (1) is configured to output a DC and a DC superimposed pulsating harmonic current to an internal sampling circuit (2) and a self-calibrated standard resistor array (3);
the internal sampling circuit (2) is configured to convert the input DC and the input DC superimposed pulsating harmonic current into a voltage signal, and to send the voltage signal to an analog-to-digital (AD) sampling and measurement component (6) through a front-end conditioning circuit (4) and a detected input channel (5);
the self-calibrated standard resistor array (3) is configured to convert the input DC and the input DC superimposed pulsating harmonic current into a voltage signal, and to send the voltage signal to the AD sampling and measurement component (6) through a channel converter (7) and a standard input channel (8); and
the external detected input module (9) is configured to convert an externally input detected signal into a suitable AD sampling range by means of the channel converter (7), and to send the AD sampling range to the AD sampling and measurement component (6) through the standard input channel (8).

2. The DC transformer error detection apparatus for a pulsating harmonic signal according to claim 1, wherein the AD sampling and measurement component (6) is connected to an error self-calibration module (10), and the error self-calibration module (10) is configured to calculate error data to be corrected and a correction value based on a digital signal of the AD sampling and measurement component (6), and to write the error data to be corrected and the correction value to a flash module (11) for storage.

3. The DC transformer error detection apparatus for a pulsating harmonic signal according to claim 2, wherein the error self-calibration module (10) is configured to receive the sampled digital signal of the AD sampling and measurement component (6), to separate a DC signal from a harmonic signal based on Fourier transform algorithm, to respectively calculate an angular difference between harmonic signals of the detected input channel (5) and the standard input channel (8), a ratio difference between the harmonic signals, an amplitude error of the DC, and an original calibration coefficient in the flash module (11), and to calculate a corrected new calibration coefficient, such that a self-calibration is completed after multi-fold calibration.

4. The DC transformer error detection apparatus for a pulsating harmonic signal according to claim 3, wherein
an amplitude error calculation module (101) is connected to an error calculation and limit determining module (102), and when a calculated amplitude error of the DC is within a preset error limit, an error compensation coefficient calculation module (103) which is internally arranged is enabled to compensate for the calculated amplitude error; and
an angular difference and ratio difference calculation module (104) is connected to the error calculation and limit determining module (102), and when an error of the calculated angular difference between the harmonic signals and an error of the calculated ratio difference between the harmonic signals are within preset error limits, the error compensation coefficient calculation module (103) is enabled to compensate for the calculated angular difference and ratio difference.

5. The DC transformer error detection apparatus for a pulsating harmonic signal according to claim 4, wherein the error calculation and limit determining module (102) is connected to an error self-correction coefficient calculation module (105), and the error self-correction coefficient calculation module (105) is connected to an original calibration coefficient calculation module (106); and in a self-calibration mode, a new calibration coefficient calculated by the error self-correction coefficient calculation module (105) is written into the flash module (11) for storage.

* * * * *